United States Patent [19]
Iwata

[11] Patent Number: 5,922,181
[45] Date of Patent: Jul. 13, 1999

[54] BLACK MATRIX LAMINATED FILM AND REACTIVE SPUTTERING APPARATUS

[75] Inventor: Hiroshi Iwata, Kanagawa-perfecture, Japan

[73] Assignee: Anelva Corporation, Tokyo, Japan

[21] Appl. No.: 08/839,862

[22] Filed: Apr. 22, 1997

Related U.S. Application Data

[62] Division of application No. 08/570,511, Dec. 11, 1995.

[30] Foreign Application Priority Data

Jan. 11, 1995 [JP] Japan ..................................... 7-19843

[51] Int. Cl.[6] .................................................. C23C 14/34
[52] U.S. Cl. ............................... 204/298.07; 204/298.23
[58] Field of Search ........................ 204/192.12, 298.07, 204/298.23

[56] References Cited

U.S. PATENT DOCUMENTS

| | | | |
|---|---|---|---|
| 4,309,261 | 1/1982 | Harding | 204/298.07 X |
| 4,871,434 | 10/1989 | Munz et al. | 204/298.07 X |
| 4,975,168 | 12/1990 | Ohno et al. | 204/298.07 X |
| 5,108,571 | 4/1992 | Ludwig et al. | 204/298.07 X |
| 5,427,665 | 6/1995 | Hartig et al. | 204/298.07 X |

Primary Examiner—Nam Nguyen
Assistant Examiner—Steven H. Ver Steeg
Attorney, Agent, or Firm—Burns, Doane, Swecker & Mathis, L.L.P.

[57] ABSTRACT

It is an object of the present invention is to provide a color liquid crystal display depicting clear images on the screen by decreasing the reflectance of external light such as solar light and room light on the black matrix. A black matrix including a laminated film is provided. The laminated film includes at least two layers each of which include at least two constituent elements. One layer is a transition layer in which the content of one of the constituent elements increases along an incident direction of external light. Also provided is a reactive sputtering apparatus suitable for preparing the laminated film for the black matrix of the present invention.

2 Claims, 7 Drawing Sheets

BLACK MATRIX LAMINATED FILM AND REACTIVE SPUTTERING APPARATUS

This application is a divisional, of application Ser. No. 08/570.511, filed Dec. 11, 1995.

BACKGROUND OF THE INVENTION

1. Field of the Invention

The present invention relates to color liquid crystal displays. In particular, the present invention relates to a black matrix for a color liquid crystal display widely used for lap-top computers and portable televisions.

2. Description of the Related Art

FIG. 11 is a cross-sectional view of a typical TN (Twisted Nematic) type color liquid crystal display having an active matrix drive. As shown in FIG. 11, a color liquid crystal display basically has a structure in which a liquid crystal material 3 is enclosed between two transparent substrates 1 and 2. The inner face of one transparent substrate 1 forms a transparent electrode 11 for a TFT (Thin Film Transistor) device, and the inner face of another transparent substrate 2 forms a color filter 21 comprising three color pixels, i.e., red, green and blue. On the surface of the color filter 21, another transparent electrode 22 is formed crossing the transparent electrode 21.

Polarizing films 110 and 210 are provided on the outer faces of the transparent substrates 1 and 2. The polarizing difference between the polarizing films 110 and 210 is a 90° angle. A back light (not shown) is provided outside the transparent substrate 1 as a light source.

When turning off the TFT device, the light passing through the polarizing film 110 from the back light is twisted to a 90° angle along the molecular orientation of the liquid crystal 3. The 90° angle-twisted light passes the polarizing film 210 through the color filter 21 and the transparent substrate 2 in series. On the other hand, when turning on the TFT device, liquid crystal molecules are oriented along the electric field due to the input voltage between the transparent electrodes 11 and 22 of the TFT device. Because the light from the back light travels straight in the oriented liquid crystal, the light cannot pass the polarizing film 210. By turning on or off each TFT device on the transparent substrate 1, a color image is displayed on the screen of the liquid crystal display.

FIG. 12 is a plan view of a color filter 21 arranging regularly stripe pixels 211, 212, and 213 of R (red), G (green), and B (blue), respectively. R, G, and B pixels are formed on the transparent electrode 2 by printing or dyeing methods. In the printing method, after preparing a printing ink by mixing a pigment with an ink base and adding desired additives, the stripe pixels are printed on the transparent electrode 2 with the prepared printing ink.

A black matrix is formed at the frame of each pixel of the color filter 21. The black matrix 5 is patterned to form the frame of the pixel 21 by etching a black thin film formed on the transparent substrate 2. As in FIG. 12, the stripe pattern of the black matrix 5 is drawn for the stripe pixel. The width of the black matrix 5 is from 10 $\mu$m to a few dozen $\mu$m. Since the black matrix 5 is an opaque black line, the black matrix 5 enhances the tone of each pixel 21. As a result, the black matrix provides a distinct tone for each color pixel of the display as a whole.

FIG. 13 is a cross-sectional view of a conventional black film used for the black matrix shown in FIG. 12. The oxides of metals such as chromium (Cr) are used for the black matrix 5 as a black material. The film of the black matrix 5 is a laminated film consisting of a chromium oxide layer 51 and chromium layer 52 thereon on the transparent substrate 2. The laminated film of the black matrix 5 is formed to stack the chromium oxide film layer 51 and chromium film layer 52 in order from the incident direction of external light, for example, sunlight and room light, through the transparent substrate 2.

One of the characteristics generally demanded of the above liquid crystal display is a decrease in reflectance of external light. High reflectance causes the image to blur due to the influence of the reflecting light on the screen of the display. The reflection of the light on the screen occurs on the black matrix which makes up the color filter. Thus, reduced reflectance on the black matrix is desired.

As an index evaluating the reflectance of the black matrix, a bottom reflectance which represents the minimum of the spectral reflectance is employed. The limit of the conventional black matrix is 5% of the bottom reflectance.

For reducing the reflectance of the black matrix, it is known to add carbon to the chromium oxide layer as an additive. According to this known method, the bottom reflectance can be reduced to around 1%. However, some pinholes occur in the black matrix because of localized coagulation of carbon. Thus, this known method significantly detracts from the quality of the liquid crystal display.

In addition, it is known to reduce the thickness of the chromium film layer to reduce the reflectance. In such case, the darkness of the black matrix itself is decreased at the same time because of thinning of the black chromium layer. Such low darkness of the black matrix allows too much light from the back light to transmit the black matrix, so that an enhanced effect of the frame of each pixel of the color filter is offset. As a result, the clearness of the tone on the screen dims in the prior art.

SUMMARY OF THE INVENTION

The foregoing drawbacks have been solved by the present invention. It is an object of the present invention to effectively reduce the reflectance of external light on the black matrix.

In order to achieve the above object, a color liquid crystal display with a black matrix containing a laminated film with at least two constituent elements is provided. The laminated film has a transition layer in which the content of one constituent element increases to approximately 20% per 100 angstroms at the most along the incident direction of external light. The content of the constituent element in the transition layer increases more than approximately 20% per the entire thickness. Preferably, the content increases approximately 0.5 to approximately 20% per 100 angstroms.

The laminated film has a layer of 1,000 to 1,400 angstroms of thickness and of approximately 50 to approximately 100% of the constituent content in order to shut out the light from the back light.

The constituent element increasing the content along the incident direction of external light is a metal element. The metal element is desirably chromium, tungsten, tantalum, titanium, iron, nickel, or molybdenum. A constituent element other than the metal element included in the laminated film is desirably oxygen, nitrogen, or carbon.

In order to produce the laminated film for the black matrix, a reactive sputtering apparatus is most desirably used. The reactive sputtering apparatus has a vacuum chamber having a pumping system, a magnetron cathode placed in the vacuum chamber, a metal target placed on the magnetron cathode, a first gas inlet system introducing a gas for magnetron discharging, a second gas inlet system introducing a reactive gas that reacts with a sputtered metal element, and a transferring system for a transparent substrate facing a discharging space. The nozzles of a first gas inlet system and a second gas inlet system are placed oppositely through the discharging space. Further, the nozzles of the second gas inlet system and first gas inlet system are placed upstream and downstream, respectively, of the transferring line of the transparent substrate. With such an arrangement, an atmosphere is formed in the discharging space such that the partial pressure of the reactive gas gradually decreases along the direction in which the transparent substrate is transferred.

The laminated film for the black matrix in the present invention effectively decreases the reflectance of external light. The color liquid crystal display using such a laminated film for the black matrix can depict clear images on the screen.

DESCRIPTION OF THE PREFERRED EMBODIMENTS

Figure 1A:
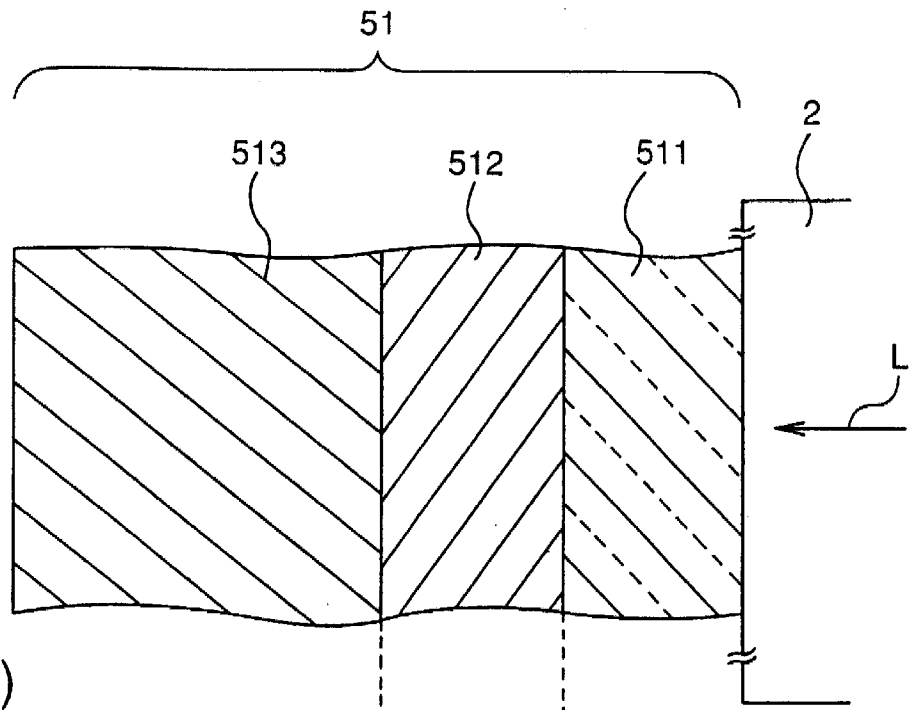
FIG. 1(a) is a cross-sectional view of one embodiment of the laminated film for the black matrix of the present invention and FIG. 1(b) is a diagram illustrating the distribution of the elemental chromium content of the laminated film for the black matrix of the present invention.
Figure 1B:
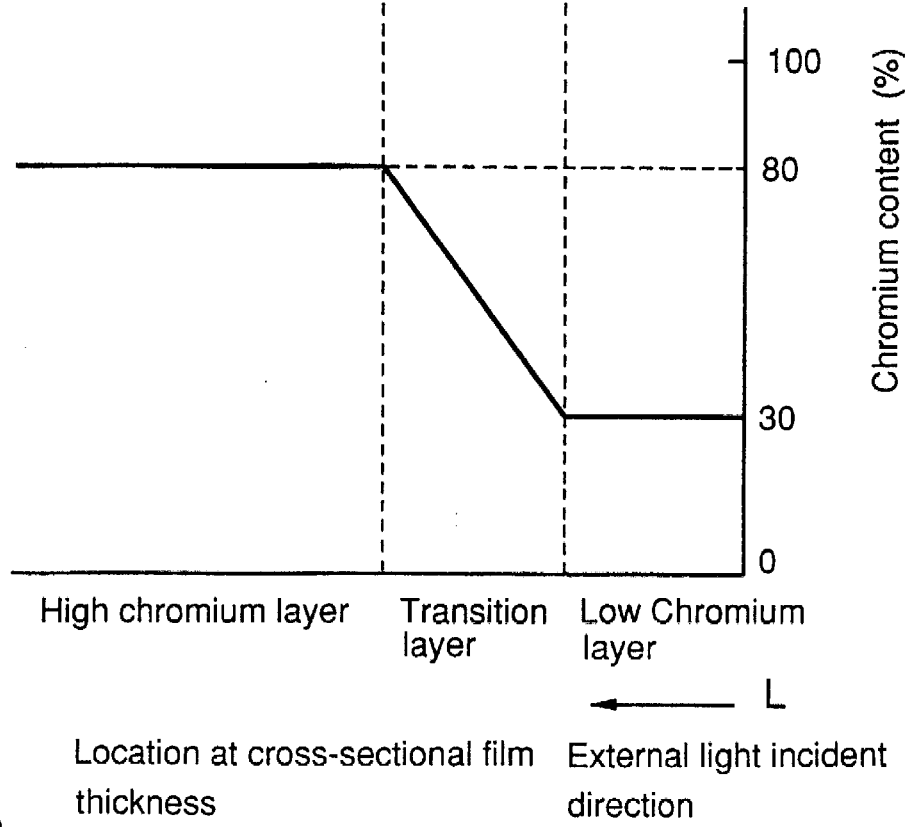

FIG. 1(a) is a cross-sectional view of a laminated film for the black matrix of the present invention and FIG. 1(b) is a diagram illustrating the distribution of the elemental chromium content corresponding to the laminated film thickness.

The laminated film of black matrix of the invention is a chromium oxide film 51 on a transparent substrate 2. A soda-lime glass plate or an alkali-free glass plate are suitable examples of a transparent substrate. The chromium content in the chromium oxide film 51 varies along the incident direction of the external light. As shown in FIG. 1, the chromium oxide film 51 consists of a low chromium layer 511, a transition layer 512 and a high chromium layer 513, in order along the incident direction (shown as an arrow L) of the external light into the liquid crystal display. The low chromium layer 511 is the lowest in the chromium content. The transition layer 512 gradually increases the chromium content along the incident direction L of the external light. The high chromium layer 513 is the highest in the chromium content.

The chromium content represents the molar ratio of the chromium element contained in each layer. As the chromium oxide compounds, the following compounds are found: $CrO$, $Cr_2O_3$, $CrO_2$, $Cr_2O_5$, $CrO_3$, $CrO_5$, $Cr_3O_5$, $Cr_5O_9$, $Cr_5O_{12}$, $Cr_5O_{13}$, $Cr_3O_8$, and $CrO_4$. Each layer may contain such various chromium oxide compounds. The ratio of the mole number of the chromium element contained in a layer including various chromium oxide compounds to the total mole number of all elements existing in the layer is defined as the chromium content of the layer.

As indicated in FIG. 1(b), the chromium content of the low chromium layer 511 is approximately 30%, and that of the high chromium layer 513 is approximately 80%. In the transition layer 512, the chromium content increases approximately 10% per 100 angstroms.

The entire thickness of the chromium oxide film 511 is approximately 2,000 angstroms. The thickness of the low chromium layer 511, the transition layer 512, and the high chromium layer 513 is approximately 400 angstroms, approximately 500 angstroms, and approximately 1,100 angstroms, respectively. The desirable thickness of the high chromium layer 513 is between approximately 1,000 and 1,400 angstroms in order to sufficiently shut out the light from the back light. On the other hand, the low chromium layer 511 is substantially not essential for the function of the black matrix. The laminated film of the black matrix consisting of the transition layer 512 and the high chromium layer 513 also demonstrates the function of the black matrix.

A preferable chromium content in the low chromium layer 511 ranges from approximately 10% to approximately 50%. The preferable content in the high chromium layer 513 ranges from approximately 50% to approximately 100%. More than approximately 80% of the chromium content in the high chromium layer is most suitable. In the transition layer 512, at least approximately 20% in the difference between the chromium contents of the high chromium layer 513 and low chromium layer 511 is most desirable. In other words, the most desirable thickness of the transition layer 512 is more than 20% per the total thickness. The increment of the chromium content in the transition layer 512 is preferably approximately 0.5% to approximately 20% per 100 angstroms. For reducing reflectance, it is desirable to make the increment smooth by making the transition layer 512 as thick as possible. However, the maximum thickness of the transition layer 512 is limited for the limitation on the total thickness of the color filter.

Figure 13:
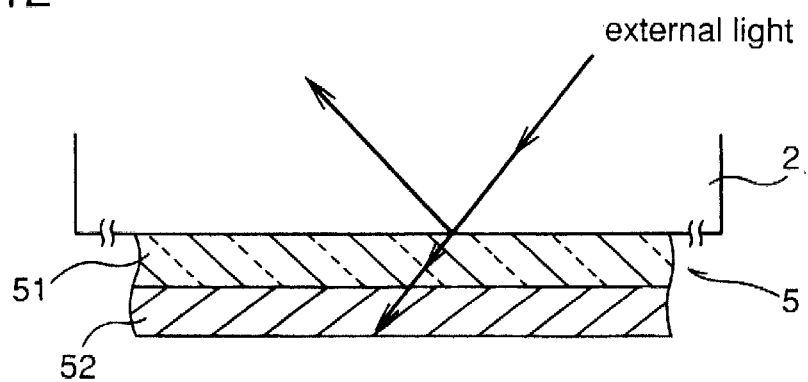
FIG. 13 is a cross-sectional view of a conventional black matrix.

It was confirmed through experiments that the laminated film interposing the above transition layer 512 significantly decreases the bottom reflectance of external light compared with the conventional laminated film comprising the chromium oxide layer 51 and the chromium layer 52 shown in FIG. 13.

Figure 2:
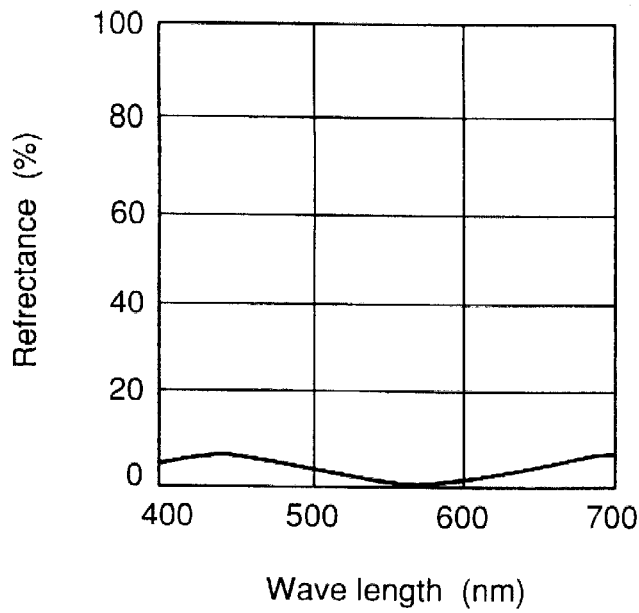
FIG. 2 is a graph illustrating the data of spectral reflectance of a laminated film for the black matrix based on a preferred embodiment of the present invention.
Figure 3:
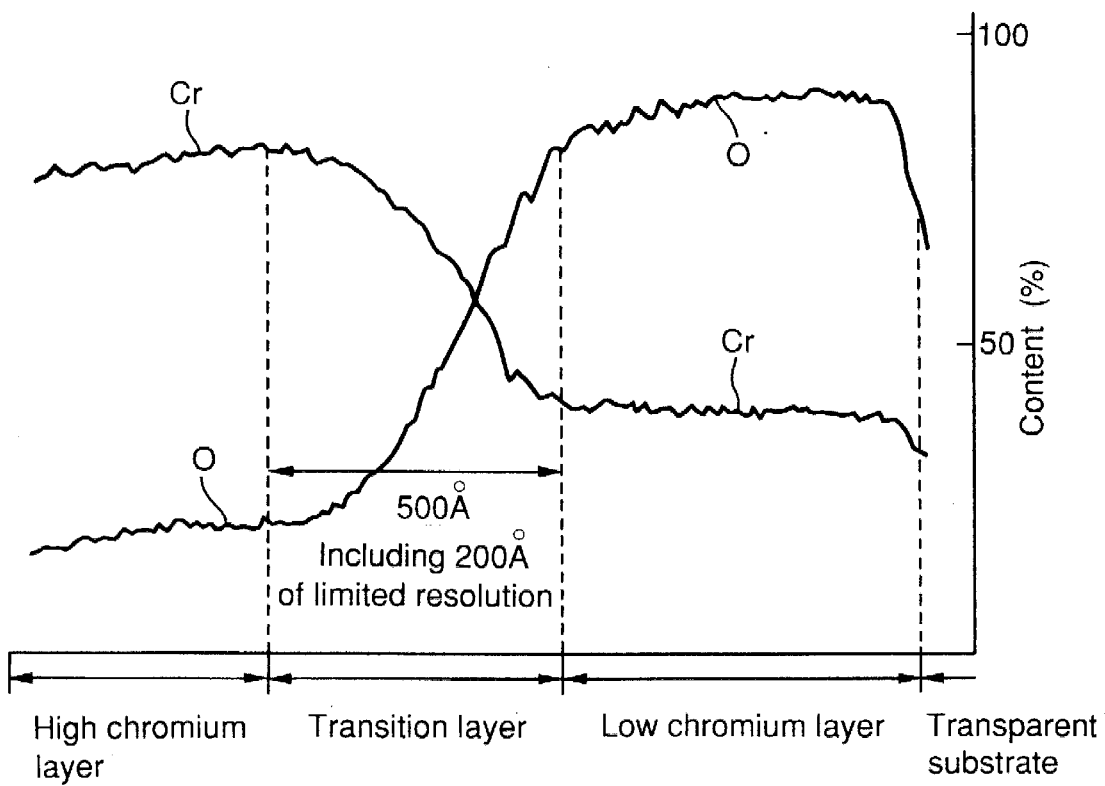
FIG. 3 is a schematic diagram illustrating the distribution of the elemental chromium in the laminated film of the chromium oxide for the black matrix based on a preferred embodiment of the present invention.
Figure 4:
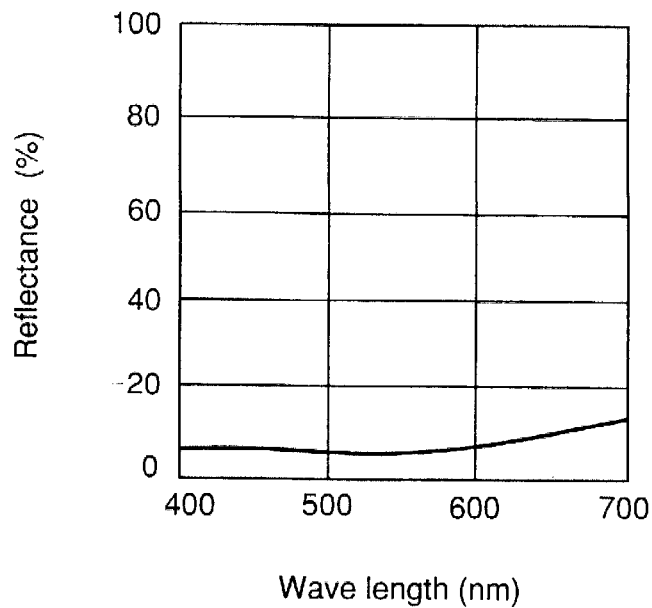
FIG. 4 is a graph illustrating the data of spectral reflectance of a conventional black matrix without a transition layer.
Figure 5:
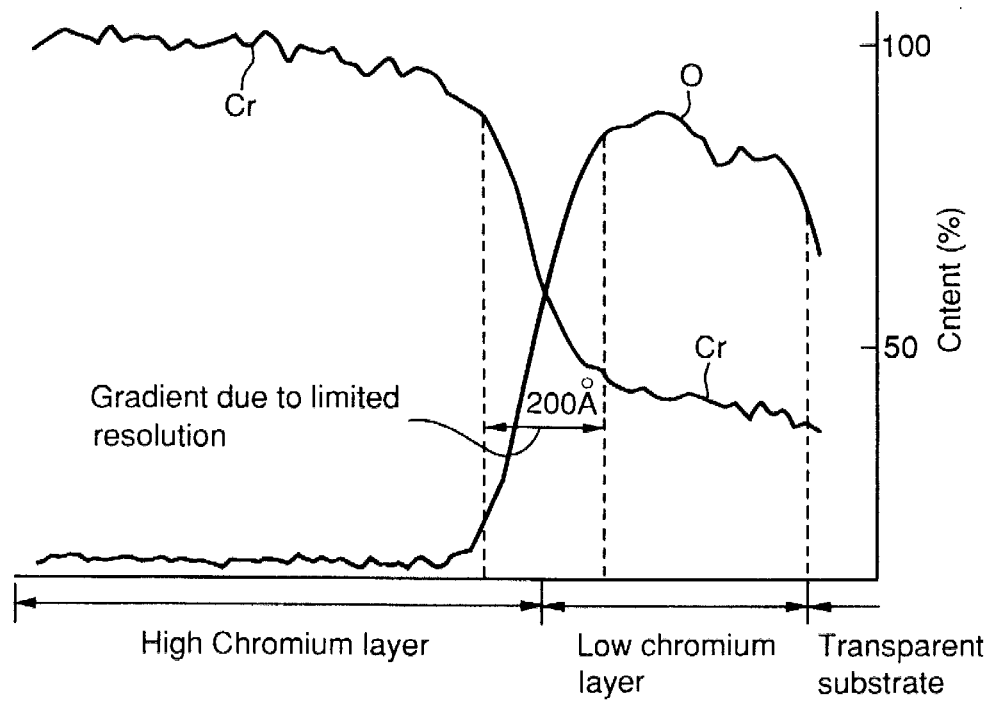
FIG. 5 is a diagram illustrating the elemental chromium distribution of the black matrix in FIG. 4.

FIG. 2 is a graph illustrating the spectral reflectance of the black matrix of the present invention, and FIG. 3 illustrates the elemental chromium content of the black matrix obtaining the result of FIG. 2. FIG. 4 is a graph illustrating the spectral reflectance of the conventional black matrix, which does not have a transition layer, and the FIG. 5 illustrates the elemental chromium content of the conventional black matrix obtaining the result of FIG. 4. In FIG. 2 and FIG. 4, the abscissa represents the wave length and the ordinate represents the reflectance. In FIG. 3 and FIG. 5, the abscissa shows the cross-sectional view of the film wherein the external light enters the liquid crystal display from the right, and the ordinate represent the content. In FIG. 3 and 5, the curves Cr and O mean the chromium and oxygen contents in the laminated film, respectively.

The bottom reflectance of the black matrix in the present invention is almost zero as shown in FIG. 2, and around 5% at highest even in the wave length range having the maximum reflectance. In FIG. 3, the elemental chromium contents of the low chromium layer and high chromium layer are approximately 40% and approximately 90%, respectively. In the transition layer, the elemental content increases approximately 50% in the 300 angstroms thickness, so the increment per 100 angstroms becomes 17%. The entire thickness of the transition layer is approximately 500 angstroms as shown in FIG. 3. Because the maximum resolution of the Auger electron spectroscope used for the determination of the chromium content is 200 angstroms, the actual gradient part on the content comprises around 300 angstroms from among the approximately 500 angstroms.

On the other hand, as shown in FIG. 4, the bottom reflectance of the black matrix not having the transition layer exceeds 5% in the all wave length ranges and reaches more than 10% in the higher reflectance regions. The elemental chromium content distribution of the black matrix in FIG. 5 demonstrates that the width of the chromium increase is only 200 angstroms corresponding to the resolution of the Auger electron spectroscope, so the transition layer could not substantially exist in this case.

While not wishing to be bound by theory, the following is believed to provide an explanation why the transition layer reduces reflectance.

Figure 6:
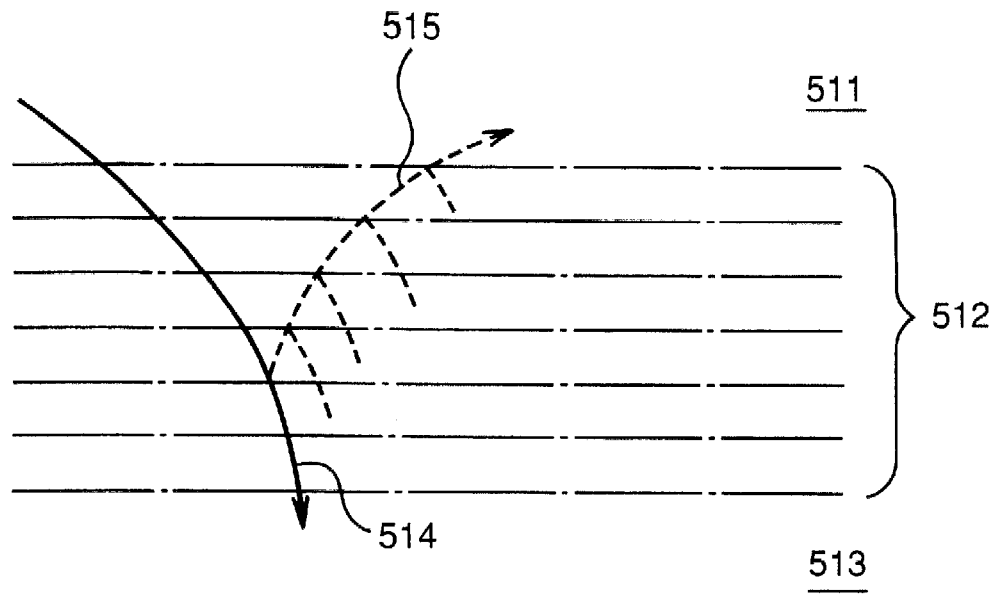
FIG. 6 is a schematic diagram of a cross-section of the transition layer.

FIG. 6 is a schematic diagram of the cross-section of the transition layer. The gradual increase of the elemental chromium content in the transition layer 512 means the gradual increase of the refractive index in the media. Due to the nature of light which is reflected toward the medium having higher refractive index, the incident angle of the external light entering the transition layer 512 gradually decreases in the media as shown in the arrow 514 in FIG. 6. When the light enters the high chromium layer, the incident angle fairly decreases so the reflectance in the high chromium layer is depressed. Furthermore, even if the light 515 reflected in the midway in the transition layer 512 proceeds first toward the low chromium layer 511, the light is gradually refracted toward the high chromium layer 513 and approaches the tangent direction of the incident face. This is because the refractive index of the transition layer 512 gradually decreases in the direction of the reflected light. It is considered that the reflected light returning to the transparent substrate 2 decreases by means of such a process.

Figure 7:
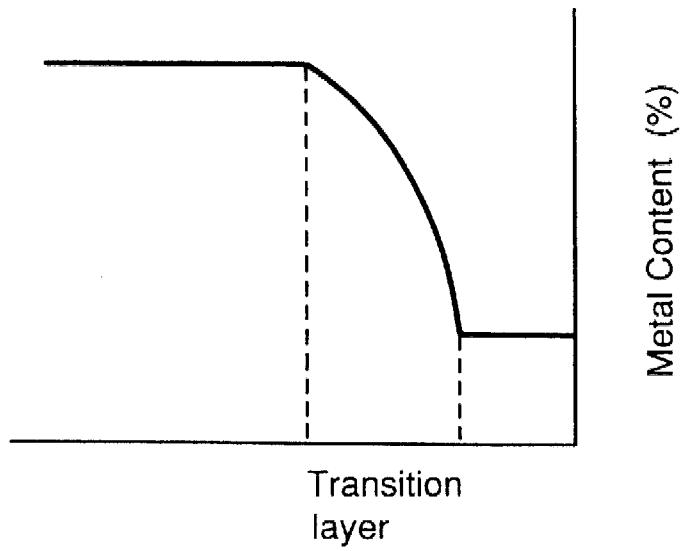
FIG. 7 is a diagram illustrating the metal content of a transition layer based on another preferred embodiment of the present invention.
Figure 8:
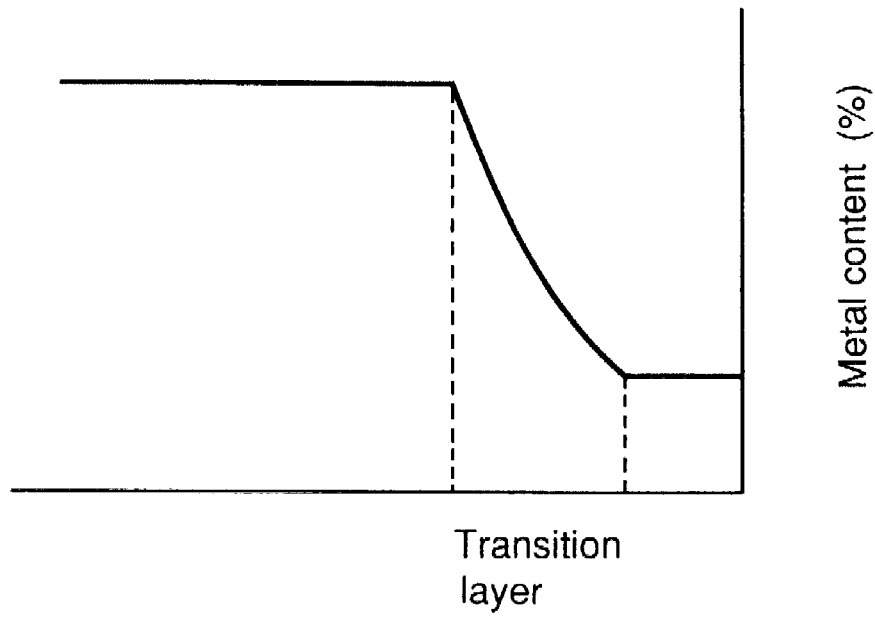
FIG. 8 is a diagram illustrating the metal content of a transition layer based on another preferred embodiment of the present invention.
Figure 9:
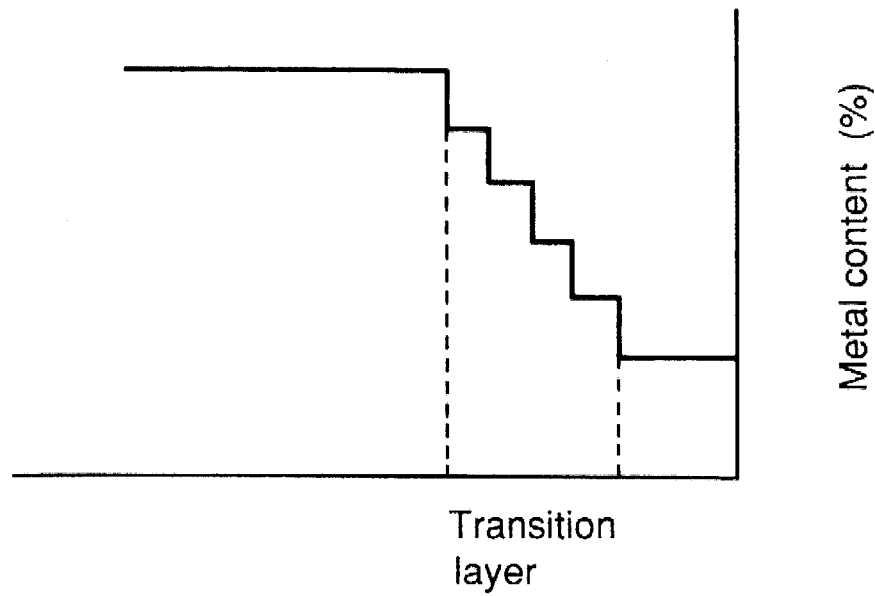
FIG. 9 is a diagram illustrating the metal content of a transition layer based on another preferred embodiment of the present invention.

FIGS. 7, 8 and 9 show other preferable embodiments of the present invention. In the elemental chromium content in the transition layer 512, arc shape increases are shown in FIGS. 7 and 8 and a stepwise increase is shown in FIG. 9. The increment per step in the stepwise increment, is limited to about 20%. A more drastic increment will lose the effect of low reflectance.

In the above embodiments, it is explained that the elemental chromium content in the transition layer gradually or step-wise increases. That means that the oxygen content gradually or step-wise decreases in the transition layer. Furthermore, nitrogen may be used for the laminated film for the black matrix in the present invention instead of oxygen.

A laminated film in the present invention comprising tungsten oxide and chromium nitride compounds other than chromium oxide compounds can be used for the black matrix. Titanium, Tantalum, Iron, Nickel or Molybdenum can be used for a metal of the laminated film in the present invention. A quaternary constituent laminated film comprising chromium, oxygen, nitrogen and carbon having a transition layer, in which the elemental chromium content gradually increases, can be used for laminated film for the black matrix.

Figure 10:
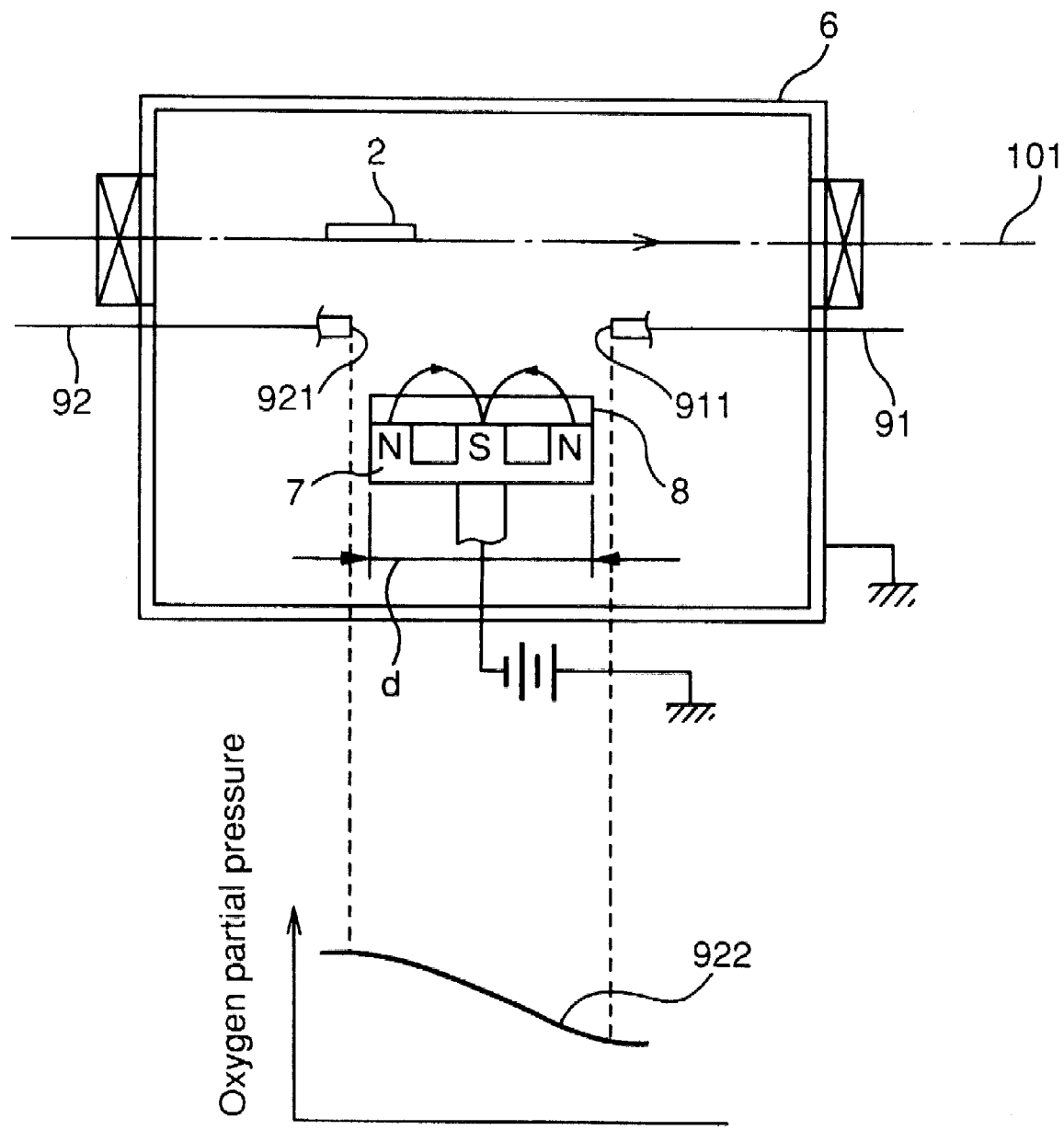
FIG. 10 is a schematic illustration of a reactive sputtering apparatus of the present invention.
Figure 11:
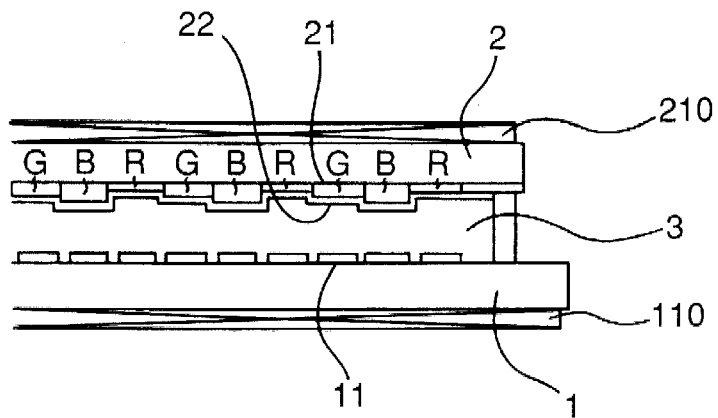
FIG. 11 is a cross-sectional view illustrating a conventional color liquid crystal display.
Figure 12:
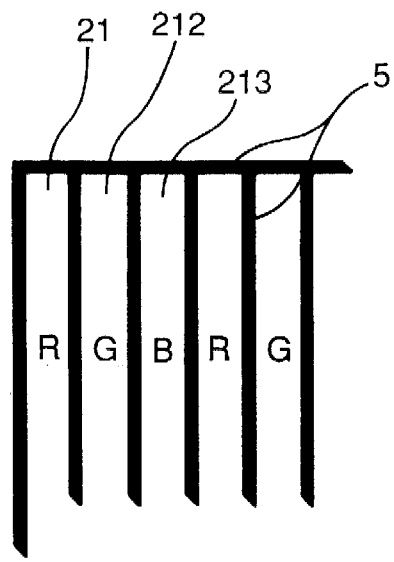
FIG. 12 is a plan view illustrating an arrangement of stripe pixels constructing the color filter.

Now the preparation of the above laminated film for the black matrix will be explained. Reactive sputtering is a suitable technique for preparing a laminated film having a layer of chromium oxide compounds in which the content of one constituent element is distributed. FIG. 10 is a schematic diagram of the reactive sputtering apparatus suitable for preparing laminated film for the black matrix.

The reactive sputtering apparatus shown in FIG. 10 comprises a vacuum chamber 6 having a pumping system, a first gas inlet system 91 introducing a gas for magnetron discharging, a second gas inlet system 92 introducing a reactant gas reacting with a sputtered metal element, a magnetron cathode 7, a metal target 8 placed on the magnetron cathode 7, and a carrier. The carrier transfers a transparent substrate 2 so as to be faced upon a discharging space.

The nozzles 911 and 921 of the first and second gas inlet systems 91 and 92 are placed oppositely through the discharging space. The nozzle 921 of the second gas inlet system 92 and the nozzle 911 of the first gas inlet system 91 are placed upstream and downstream of the transferring line of the transparent substrate, respectively.

In reactive sputtering, the film comprising a metal element and a reactive gas constituent element is deposited on the transparent substrate 2 by the reaction between the metal element sputtered from the target 8 due to magnetron discharge and the reactive gas introduced from the nozzle 921. It is an advantage of the reactive sputtering that the contents of the metal element and the reactive gas constituent element in the film are adjustable by means of adjusting the reactive gas pressure.

Because the nozzles 921 and 911 are placed oppositely as described above, the partial pressure of the reactive gas has a gradient in the discharging space as shown in the curve 922 of the oxygen partial pressure in FIG. 10. The discharging space has an atmosphere that the partial pressure of the reactive gas gradually decreases toward the transferring direction of the transparent substrate 2.

By transferring a transparent substrate 2 so as to face upon such a discharging space, because the substrate 2 faces upon an atmosphere of high reactive gas partial pressure, a layered film having high reactive gas constituent element content, i.e., low metal element content can be deposited. With the transfer of the transparent substrate 2 in an atmosphere where the reactive gas partial pressure gradually decreases, a layered film of gradually increased metal element content can be deposited. When the substrate 2 reaches near the nozzle 911, a layered film having highest metal content can be deposited. The laminated film having a gradient of the metal content along the cross-section of the film can be deposited in such a way.

The preparation of the chromium oxide laminated film used for the black matrix shown in FIG. 1(a) and 1(b) using the reactive sputtering apparatus in the present invention will be explained. A rectangular chromium target 8 having 150 mm of width and 700 cm of length is placed in the vacuum chamber 6. Argon gas and oxygen gas are introduced from the first gas inlet system 91 and second gas inlet system 92, respectively, in the vacuum chamber 6. The oxygen gas is injected from the nozzle 921 at a flow rate of 10 cm$^3$/min, and the argon gas is injected from the nozzle 911 at a flow rate of 200 cm$^3$/min. The pressure of the vacuum chamber 6 is set to 0.5 Pa. The sputtering space is maintained to an atmosphere where the oxygen gas partial pressure gradually decreases toward the transferring direction of the transparent substrate 2 as shown in the curve 922 of the graph in FIG. 10. Magnetron discharge is generated by applying 1,000 W of electric power to the magnetron cathode 7 in the discharging space having such an atmosphere. The transparent substrate 2 is transferred at a rate of around 200 mm/min on the transferring line 101. The transferring transparent substrate 2 is around 100 mm from the chromium target 8. The laminated film of the chromium oxide compounds for the black matrix can be deposited on the transparent substrate 2 in such a way.

Using a reactive sputtering apparatus in the present invention, the laminated structure based on the present invention can be applied to the insulating SiO$_2$ laminated film for the drive electrode of liquid crystal display and the insulating Ta$_2$O$_5$ laminated film for the drive electrode of MIM (Metal Insulator Metal) system.

On forming the laminated film of chromium nitride compounds using a reactive sputtering apparatus in the present invention, nitrogen gas may be introduced from the second gas inlet system 92 in the vacuum chamber 6 instead of oxygen gas.

What is claimed is:

1. A reactive sputtering apparatus comprising a vacuum chamber having a pumping system, a magnetron cathode placed in the vacuum chamber, a metal target placed on the magnetron cathode, a first gas inlet system comprising a first nozzle for introducing a gas for magnetron discharging, a second gas inlet system comprising a second nozzle for introducing a reactant gas which reacts with a sputtered metal element, and a transferring system for transferring a transparent substrate to a discharging space;

wherein the first nozzle and the second nozzle directly face each other and are placed oppositely through the discharging space, the second nozzle is placed upstream of a transferring line for the transparent substrate, and the first nozzle is placed downstream of a transferring line for the transparent substrate.

2. The apparatus according to claim 1, wherein at least one of said first nozzle and second nozzle does not point downward towards a surface of the transparent substrate.

* * * * *